(12) United States Patent
Feng

(10) Patent No.: US 10,854,544 B2
(45) Date of Patent: Dec. 1, 2020

(54) ANTI-FUSE STRUCTURE CIRCUIT AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Junhong Feng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/512,869

(22) Filed: Jul. 16, 2019

(65) Prior Publication Data
US 2020/0020630 A1    Jan. 16, 2020

(30) Foreign Application Priority Data
Jul. 16, 2018   (CN) .......................... 2018 1 0777344

(51) Int. Cl.
*H01L 23/525*    (2006.01)
*H01L 27/112*    (2006.01)

(52) U.S. Cl.
CPC .... *H01L 23/5252* (2013.01); *H01L 27/11206* (2013.01)

(58) Field of Classification Search
CPC ....................... H01L 23/5252; H01L 27/11206
USPC ........................................................... 257/50
See application file for complete search history.

(56) References Cited

U.S. PATENT DOCUMENTS 8,878,291 B2 * 11/2014 Jung ................. H01L 29/42356
257/331

* cited by examiner

*Primary Examiner* — Tu-Tu V Ho
(74) *Attorney, Agent, or Firm* — Anova Law Group, PLLC

(57) ABSTRACT

Anti-fuse structure circuit and method of forming an anti-fuse structure circuit are provided. A substrate is provided, and an anti-fuse is formed on the substrate by forming a first gate structure and a dielectric layer on the substrate and forming conductive plugs respectively in the dielectric layer at two sides of the first gate structure. The dielectric layer covers the first gate structure, and the conductive plugs have a width decreasing from top to bottom. A second gate structure is formed on the substrate. A top surface of the first gate structure is higher than a top surface of the second gate structure. The dielectric layer also covers the second gate structure. The conductive plugs are also located respectively in the dielectric layer at two sides of the second gate structure.

20 Claims, 5 Drawing Sheets

ANTI-FUSE STRUCTURE CIRCUIT AND FORMING METHOD THEREOF

CROSS-REFERENCES TO RELATED APPLICATIONS

This application claims priority of Chinese Patent Application No. 201810777344.1, filed on Jul. 16, 2018, the entire content of which is hereby incorporated by reference.

FIELD OF THE INVENTION

The present disclosure generally relates to the field of semiconductor manufacturing and, more particularly, relates to anti-fuse structure circuits and forming methods thereof.

BACKGROUND

In semiconductor industry, fuse elements are widely used in integrated circuits for a variety of applications. For example, a plurality of circuit modules with a same function may be designed as backups in an integrated circuit. When one of the circuit modules fails, fuse elements between the failed circuit module and other functional circuits in the integrated circuit may be burnt out. As such, another circuit module with the same function may replace the failed circuit module.

With continuous development of semiconductor technology, anti-fuse technologies have attracted attentions. An anti-fuse structure is a structure whose electric conductive state may be changed. An anti-fuse structure is not electrically conductive when it is not activated, and it is electrically conductive when it is activated. Accordingly, the anti-fuse structure may selectively, electrically connect two devices or chips that are originally electrically isolated.

However, performances of existing anti-fuse structures are undesirable. The disclosed methods and structures are directed to solve one or more problems set forth above and other problems in the art.

BRIEF SUMMARY OF THE DISCLOSURE

One aspect of the present disclosure includes a method of forming an anti-fuse structure circuit. A substrate is provided, and an anti-fuse is formed on the substrate by a process including forming the anti-fuse includes forming a first gate structure and a dielectric layer on the substrate and forming conductive plugs respectively in the dielectric layer at two sides of the first gate structure. The dielectric layer covers the first gate structure, and the conductive plugs have a width decreasing from top to bottom. A second gate structure is formed on the substrate. A top surface of the first gate structure is higher than a top surface of the second gate structure. The dielectric layer also covers the second gate structure. The conductive plugs are also located respectively in the dielectric layer at two sides of the second gate structure.

Another aspect of the present disclosure includes an anti-fuse structure circuit. The anti-fuse structure circuit includes a substrate and an anti-fuse. The anti-fuse includes a first gate structure and a dielectric layer that are located on the substrate. The dielectric layer covers the first gate structure. The anti-fuse also includes conductive plugs located respectively in the dielectric layer at two sides of the first gate structure. The conductive plugs have a width decreasing from top to bottom. The anti-fuse structure circuit also includes a second gate structure located on the substrate. A top surface of the first gate structure is higher than a top surface of the second gate structure. The dielectric layer also covers the second gate structure. The conductive plugs are also located respectively in the dielectric layer at two sides of the second gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

Figure 1:
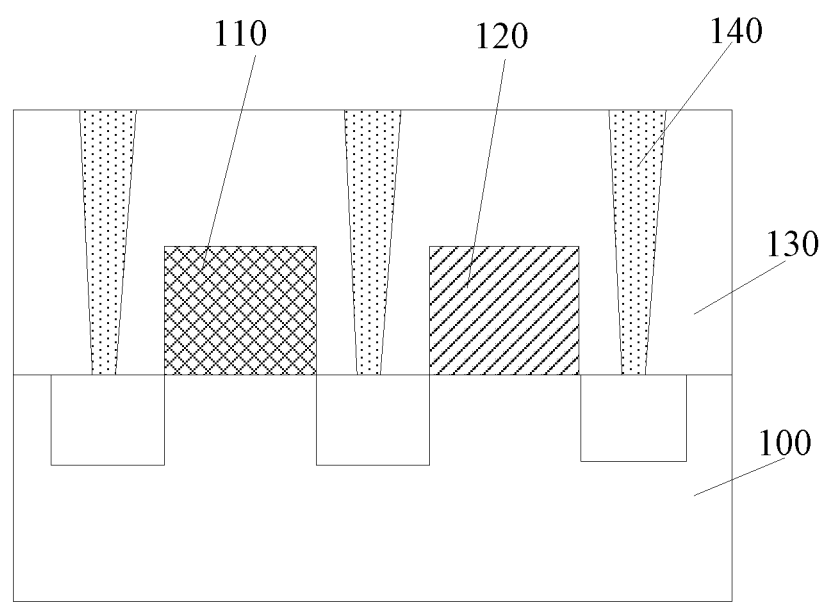
FIG. 1 illustrates an anti-fuse structure circuit.

FIG. 1 illustrates an anti-fuse structure circuit. As shown in FIG. 1, the anti-fuse structure circuit includes a substrate 100, a first gate structure 110, a second gate structure 120, and a dielectric layer 130. The first gate structure 110, the second gate structure 120, and the dielectric layer 130 are disposed on the substrate 100. The dielectric layer 130 covers the substrate 100, the first gate structure 110 and the second gate structure 120. A top surface of the first gate structure 110 is flush with a top surface of the second gate structure 120. The anti-fuse structure circuit also includes conductive plugs 140. The conductive plugs 140 are located respectively in the dielectric layer 130 at two sides of the first gate structure 110, and the dielectric layer 130 at two sides of the second gate structure 120. The conductive plugs 140 have a width decreasing from top to bottom. The first gate structure 110, the conductive plug 140 at one side of the first gate structure 110, and the dielectric layer 130 between the first gate structure 110 and the conductive plug 140 at one side of the first gate structure 110 constitute an anti-fuse.

During a process of forming the conductive plugs 140, the dielectric layer 130 at two sides of the first gate structure 110 and the dielectric layer 130 at two sides of the second gate structure 120 may be etched by an anisotropic dry etching process until a surface of the substrate 100 is exposed. Plug holes may be formed in the dielectric layer 130 at two sides of the first gate structure 110 and in the dielectric layer 130 at two sides of the second gate structure 120 respectively. The conductive plugs 140 may be formed in the plug holes.

In a process of etching the dielectric layer 130 to form the plug holes, when etching depths increase, it may be difficult for etching gas to enter the plug holes, and etching by-products may accumulate at bottom regions of the plug holes. Accordingly, it may be difficult to discharge the etching by-products. Thus, when the etching depths increase, widths of the plug holes may decrease. Correspondingly, the widths of the conductive plugs 140 may decrease from top to bottom.

The first gate structure 110 includes a first gate dielectric layer. The second gate structure 120 includes a second gate dielectric layer. As a feature size of an anti-fuse structure circuit continuously decreases, thicknesses of the first gate dielectric layer and the second gate dielectric layer may also continuously decrease. To avoid breakdown of the first gate dielectric layer and the second gate dielectric layer, it may be necessary to correspondingly reduce an electric voltage applied to the first gate structure 110 and an electric voltage applied to the second gate structure 120.

But, when the electric voltage applied to the first gate structure 110 is small, it may be difficult to break down the anti-fuse, and the breakdown time of the anti-fuse may be long. That is, when a small electric voltage is applied to the first gate structure 110, it may be difficult to reduce the breakdown time of the anti-fuse. Accordingly, it may be necessary to reduce a programming voltage and a programming time of the anti-fuse.

The present disclosure provides an anti-fuse structure. An anti-fuse is formed on a substrate. A method of forming the anti-fuse includes forming a first gate structure and a dielectric layer on the substrate, the dielectric layer covering the first gate structure. The method also includes respectively forming conductive plugs in the dielectric layers at two sides of the first gate structure. The conductive plugs have a width decreasing from top to bottom. The method further includes forming a second gate structure on the substrate. A top surface of the first gate structure is higher than a top surface of the second gate structure. The dielectric layer also covers the second gate structure, and the conductive plugs are also respectively located in the dielectric layer at two sides of the second gate structure. The method may reduce the programming voltage and the programming time of the anti-fuse.

Figure 2:
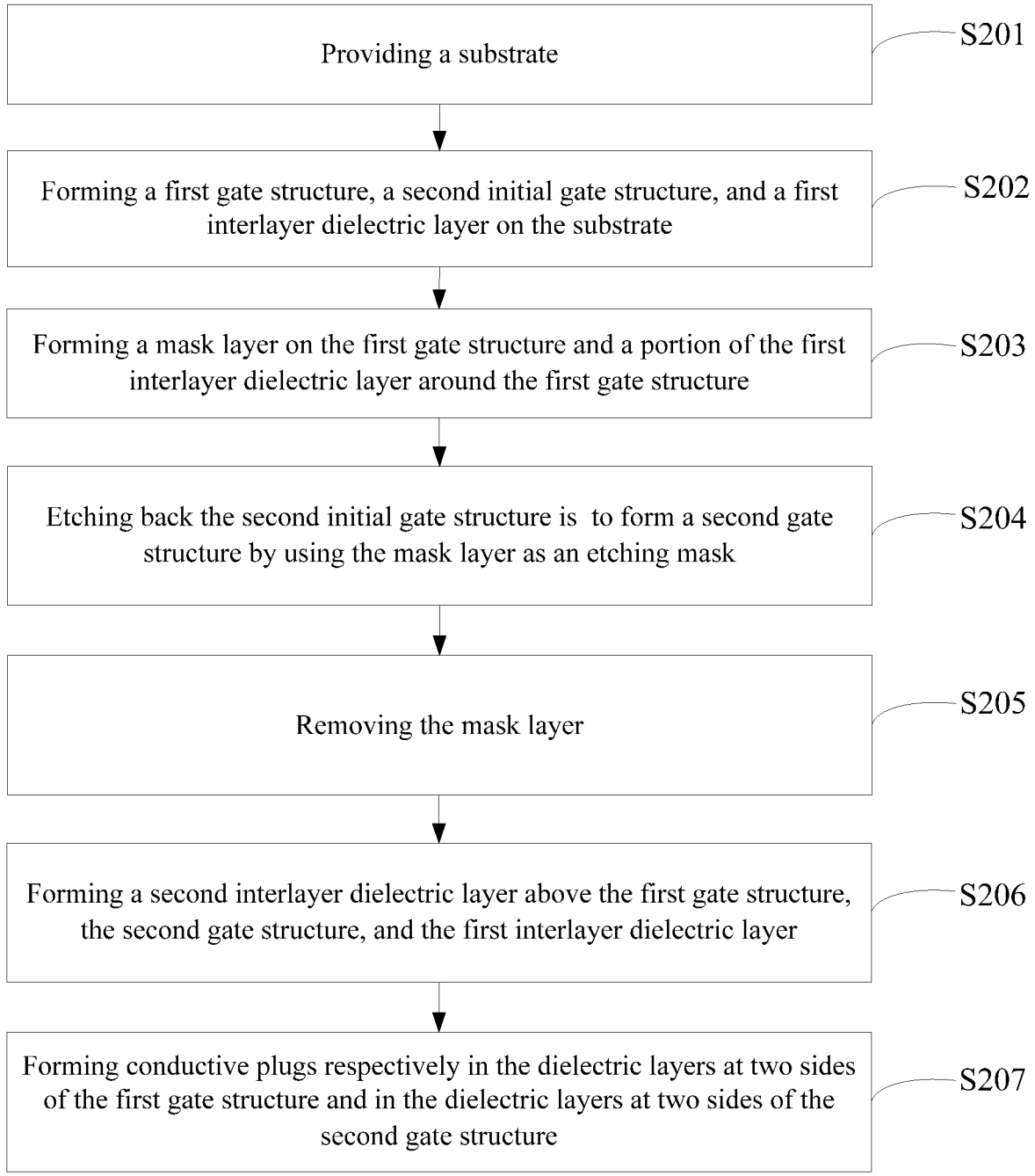
FIG. 2 illustrates an exemplary process of forming an anti-fuse structure circuit consistent with the disclosed embodiments.

FIG. 2 illustrates an exemplary process of forming an anti-fuse structure circuit consistent with the disclosed embodiments. FIGS. 3 to 9 illustrate semiconductor structures corresponding to certain stages of the exemplary process of forming an anti-fuse structure circuit.

Figure 3:
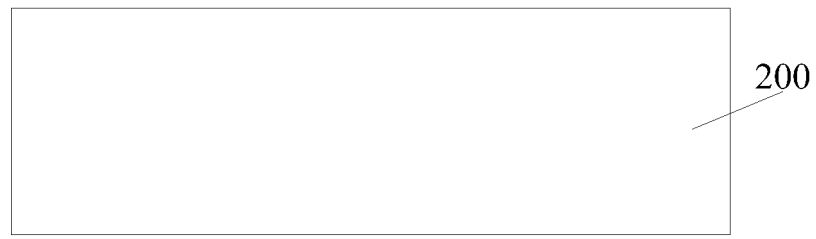
FIGS. 3 to 9 illustrate semiconductor structures corresponding to certain stages of a process of forming an exemplary anti-fuse structure circuit consistent with the disclosed embodiments.

As shown in FIG. 2, at the beginning of the exemplary process of forming an anti-fuse structure circuit, a substrate may be provided (S201). FIG. 3 illustrates a corresponding structure. As shown in FIG. 3, a substrate 200 is provided. The substrate 200 may be a bulk silicon substrate, a bulk germanium substrate, a glass substrate, a silicon-on-insulator substrate, or a germanium-on-insulator substrate.

In one embodiment, the substrate 200 is a bulk silicon substrate. In some other embodiments, the substrate may include a semiconductor substrate and a fin on the semiconductor substrate.

An anti-fuse may be then formed on the substrate 200. A process of forming the anti-fuse includes forming a first gate structure and a dielectric layer on the substrate 200. The dielectric layer covers the first gate structure. The process of forming the anti-fuse also includes forming a second gate structure on the substrate 200. A top surface of the first gate structure is higher than a top surface of the second gate structure, and the dielectric layer also covers the second gate structure.

The dielectric layer includes a first interlayer dielectric layer and a second interlayer dielectric layer.

In one embodiment, the process of forming the anti-fuse also includes forming a first sidewall spacer and a second sidewall spacer. The first sidewall spacer is located at a sidewall of the first gate structure, and the second sidewall spacer is located at a sidewall of the second gate structure. A top surface of the first gate structure is flush with a top surface of the first sidewall spacer, and a top surface of the second gate structure is lower than a top surface of the second sidewall spacer. The first interlayer dielectric layer covers a sidewall of the first sidewall spacer and a sidewall of the second sidewall spacer. The second interlayer dielectric layer is also located on the first sidewall spacer and the second sidewall spacer.

Figure 4:
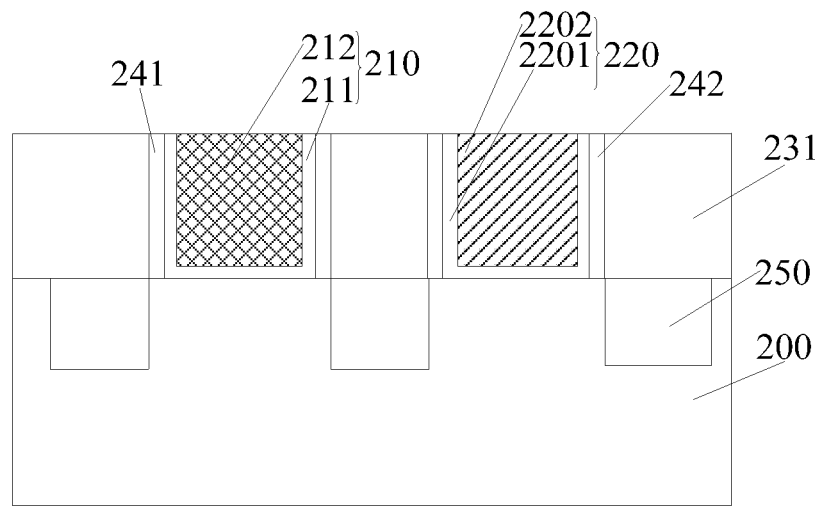

Returning to FIG. 2, after providing the substrate, a first gate structure, a second initial gate structure, and a first interlayer dielectric layer may be formed on the substrate (S202). FIG. 4 illustrates a corresponding structure.

As shown FIG. 4, a first gate structure 210, a second initial gate structure 220, and a first interlayer dielectric layer 231 are formed on the substrate 200. A height of the first gate structure 210 and a height of the second initial gate structure 220 are same. The first interlayer dielectric layer 231 covers a sidewall of the first gate structure 210 and a sidewall of the second initial gate structure 220. The first interlayer dielectric layer 231 exposes a top surface of the first gate structure 210 and a top surface of the second initial gate structure 220.

Specifically, a first dummy gate structure (not shown) and a second dummy gate structure (not shown) are formed on the substrate 200. A first sidewall spacer 241 is formed on a sidewall of the first dummy gate structure, and a second sidewall spacer 242 is formed on a sidewall of the second dummy gate structure. Thereafter, source/drain doped regions 250 are formed. The source/drain doped regions 250 are respectively located in the substrate 200 at two sides of the first dummy gate structure and the first sidewall spacer 241, and in the substrate 200 at two sides of the second dummy gate structure and the second sidewall spacer 242. Thereafter, a first interlayer dielectric layer 231 is formed on the substrate 200. The first interlayer dielectric layer 231 covers a sidewall of the first sidewall spacer 241 and a sidewall of the second sidewall spacer 242. The first interlayer dielectric layer 231 exposes top surfaces of the first sidewall spacer 241 and the second sidewall spacer 242, and top surfaces of the first dummy gate structure and the second dummy gate structure.

After the first interlayer dielectric layer 231 is formed, the first dummy gate is removed, forming a first gate opening in the first interlayer dielectric layer 231. A sidewall of the first gate opening exposes the first sidewall spacer 241. After the first interlayer dielectric layer 231 is formed, the second dummy gate structure is removed, forming a second gate opening in the first interlayer dielectric layer 231. A sidewall of the second gate opening exposes the second sidewall spacer 242. A first gate structure 210 is formed in the first gate opening, and a second initial gate structure 220 is formed in the second gate opening. A top surface of the first gate structure 210 is flush with a top surface of the second initial gate structure 220.

The first gate structure 210 includes a first gate dielectric layer 211 on the substrate 200 and a first gate electrode layer 212 on the first gate dielectric layer 211. Specifically, the first gate dielectric layer 211 is located at a sidewall and a bottom of the first gate opening.

The second initial gate structure 220 includes a second initial gate dielectric layer 2201 on the substrate 200 and a second initial gate electrode layer 2202 on the second initial gate dielectric layer 2201. Specifically, the second initial gate dielectric layer 2201 is located at a sidewall and a bottom of the second gate opening.

The first gate dielectric layer 211 and the first initial gate dielectric layer 2201 are made of a material including a high K dielectric material (K is greater than approximately 3.9). The first gate electrode layer 212 and the first initial gate electrode layer 2202 are made of a material including metal.

Thereafter, the second initial gate structure 220 may be etched back to lower a height of the second initial gate structure 220, and the second initial gate structure 220 may thus turn into a second gate structure. A second interlayer dielectric layer may be formed on the first gate structure 210, the second gate structure and the first interlayer dielectric layer 231.

In one embodiment, the process of forming the anti-fuse also includes, before etching back the second initial gate structure 220, forming a mask layer on the first gate structure 210 and a portion of the first interlayer dielectric layer 231 around the first gate structure 210. The mask layer exposes the second initial gate structure 220. The process of forming the anti-fuse also includes, using the mask layer as an etching mask, etching back the second initial gate structure 220 to form a second gate structure.

Figure 5:
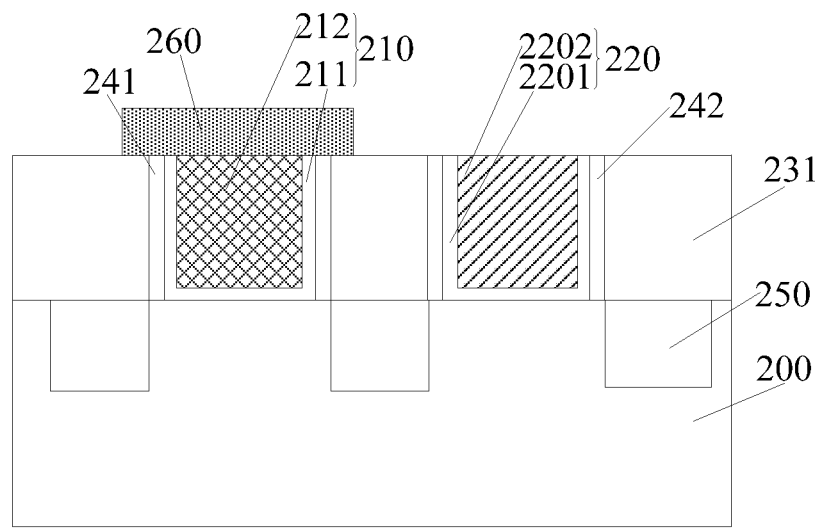

Returning to FIG. 2, after forming the first gate structure, the second initial gate structure, and the first interlayer dielectric layer, a mask layer may be formed on the first gate structure and a portion of the first interlayer dielectric layer around the first gate structure 210 (S203). FIG. 5 illustrates a corresponding structure.

As shown in FIG. 5, a mask layer 260 is formed on the first gate structure 210 and a portion of the first interlayer dielectric layer 231 around the first gate structure 210. The mask layer 260 exposes the second initial gate structure 220. The mask layer 260 is made of a material including a photoresist. In one embodiment, the mask layer 260 is also located above the first sidewall 241.

Figure 6:
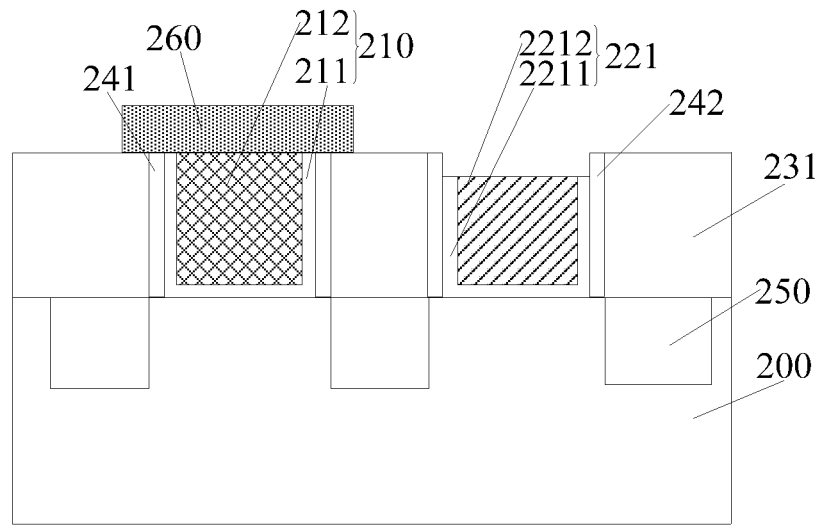

Returning to FIG. 2, after forming the mask layer, the second initial gate structure may be etched back to form a second gate structure by using the mask layer as an etching mask (S204). FIG. 6 illustrates a corresponding structure.

As shown in FIG. 6, the second initial gate structure 220 is etched back to form a second gate structure 221 by using the mask layer 260 as an etching mask. A top surface of the first gate structure 210 is higher than a top surface of the second gate structure 221.

After the first gate structure 210 and the second gate structure 221 are formed, the first sidewall spacer 241 is located on a sidewall of the first gate structure 210, and a top surface of the first sidewall spacer 241 is flush with a top surface of the first gate structure 210. The second sidewall spacer 242 is located on a sidewall of the second gate structure 221, and a top surface of the second sidewall spacer 242 is higher than a top surface of the second gate structure 221. The source/drain doped regions 250 are located respectively in the substrate 200 at two sides of the first gate structure 210 and in the substrate 200 at two sides of the second gate structure 221. Specifically, the source/drain doped regions 250 are located respectively in the substrate 200 at two sides of the first gate structure 210 and the first sidewall spacer 241, and in the substrate 200 at two sides of the second gate structure 221 and the second sidewall spacer 242.

In one embodiment, the first gate structure 210 and the second gate structure 221 share a source/drain. In some other embodiments, the first gate structure and the second gate structure do not share a source/drain.

The semiconductor structure shown in FIG. 6 may contain one second gate structure 221 or more than one second gate structures 221. The second gate structure 221 includes a second gate dielectric layer 2211 on the substrate 200 and a second gate electrode layer 2212 on the second gate dielectric layer 2211. The second gate dielectric layer 2211 is formed by etching the second initial gate dielectric layer 2201, and the second gate electrode layer 2212 is formed by etching the second initial gate electrode layer 2202.

A top surface of the first gate electrode layer 212 is higher than a top surface of the second gate electrode layer 2212. The top surface of the first gate electrode layer 212 is a partial top surface of the first gate structure 210, and the top surface of the second gate electrode layer 2212 is a partial top surface of the second gate structure 221.

In one embodiment, a height of the first gate structure 210 is approximately 1.1 times to 1.3 times a height of the second gate structure 221. If the height of the first gate structure 210 is less than approximately 1.1 times the height of the second gate structure 221, a difference between the height of the first gate structure 210 and the height of the second gate structure 221 may be small. When the height of the second gate structure 221 is fixed, the height of the first gate structure 210 may be too small. Accordingly, a minimum distance between the first gate structure 210 and the adjacent conductive plug may be large, and thus it may be difficult to effectively reduce the programming voltage and the programming time of the anti-fuse.

If the height of the first gate structure 210 is greater than approximately 1.3 times the height of the second gate structure 221, the difference between the height of the first gate structure 210 and the height of the second gate structure 221 may be large. When the height of the second gate structure 221 is determined, the height of the first gate structure 210 may be too large, and thus the first gate structure 210 may topple. When the first gate structure 210 has a suitable height, the height of the second gate structure 221 may be too small, and thus electrical characteristics of the second gate structure 221 may be affected. For example, if the height of the second gate structure 221 is too small, the electrical resistance of the second gate electrode layer 2212 may be too large. Besides, when the second gate structure 221 also includes a second work function layer between the second gate dielectric layer 2211 and the second gate electrode layer 2212, a small height of the second gate structure 221 may result in a big loss of the second work function layer. Accordingly, a threshold voltage of a transistor corresponding to the second gate structure 221 may fluctuate.

In one embodiment, a thickness of the first gate dielectric layer 211 is greater than a thickness of the second gate dielectric layer 2211. Accordingly, breakdown of the first gate dielectric layer 211 may be avoided before breakdown of the anti-fuse, and the anti-fuse programming voltage may have a large selection range.

The thickness of the first gate dielectric layer 211 may be approximately 1.2 times to 5 times the thickness of the second gate dielectric layer 2211. Within this range, the thicknesses of the first gate dielectric layer 211 and the second gate dielectric layer 2211, as well as the heights of the first gate structure 210 and the second gate structure 221 may be adjusted. By selecting a suitable programming voltage of the anti-fuse and a suitable operating voltage applied to the second gate structure 221, the programming voltage of the anti-fuse may be equal to the operating voltage applied to the second gate structure 221.

A characteristic that the programming voltage of the anti-fuse is equal to the operating voltage applied to the second gate structure 221 may have following advantages. Since the voltage applied to the first gate structure 210 is equal to the voltage applied to the second gate structure 221, a same type of power module may be used to supply voltages to both the first gate structure 210 and the second gate structure 221. Accordingly, the power module system may be simplified.

In some other embodiments, the thickness of the first gate dielectric layer may be less than or equal to the thickness of the second gate dielectric layer. In some other embodiments, the programming voltage of the anti-fuse may be greater than the operating voltage applied to the second gate structure.

Figure 7:
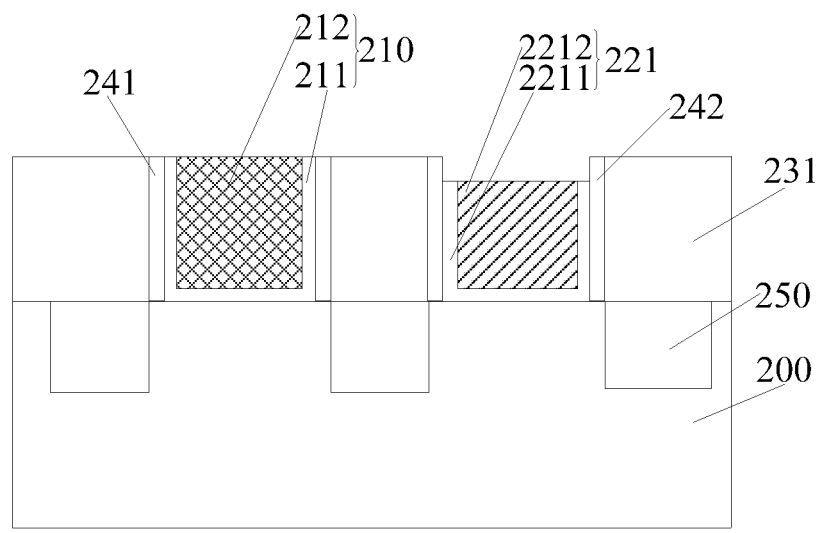

Returning to FIG. 2, after forming the second gate structure, the mask layer may be removed (S205). FIG. 7 illustrates a corresponding structure. As shown in FIG. 7, the mask layer 260 is removed (refer to FIG. 6).

Figure 8:
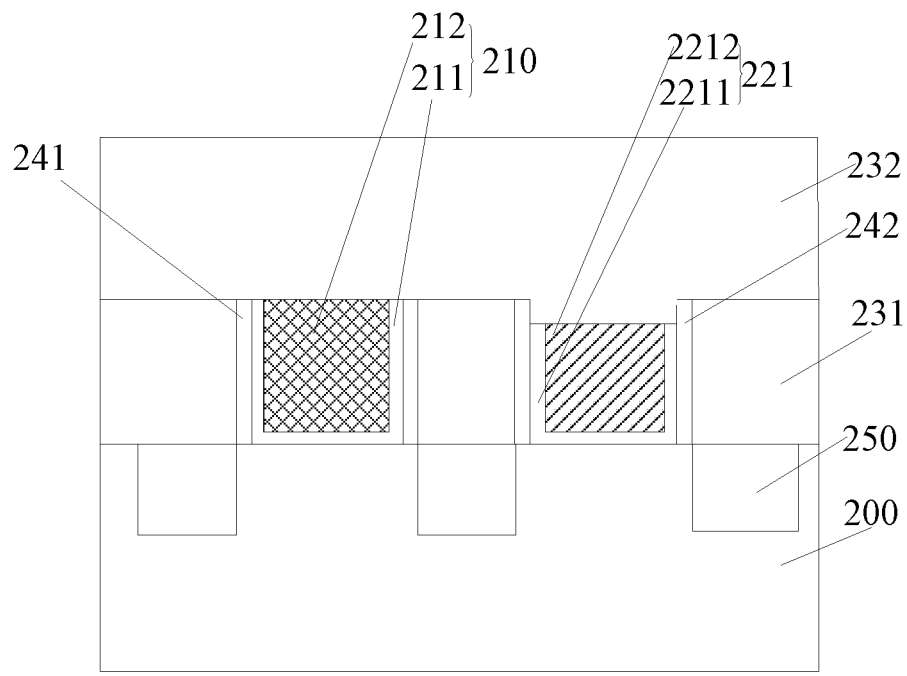

Returning to FIG. 2, after removing the mask layer, a second interlayer dielectric layer may be formed above the first gate structure, the second gate structure, and the first interlayer dielectric layer (S206). FIG. 8 illustrates a corresponding structure.

As shown in FIG. 8, a second interlayer dielectric layer 232 is formed above the first gate structure 210, the second gate structure 221, and the first interlayer dielectric layer 231. The second interlayer dielectric layer 232 is also located above the first sidewall spacer 241 and the second sidewall spacer 242. The first interlayer dielectric layer 231 and the second interlayer dielectric layer 232 constitute a dielectric layer.

The process of forming the anti-fuse also includes forming conductive plugs in the dielectric layers at two sides of the first gate structure 210 respectively. The conductive plugs have a width decreasing from top to bottom. The conductive plugs are also located in the dielectric layers at two sides of the second gate structure 221 respectively.

Figure 9:
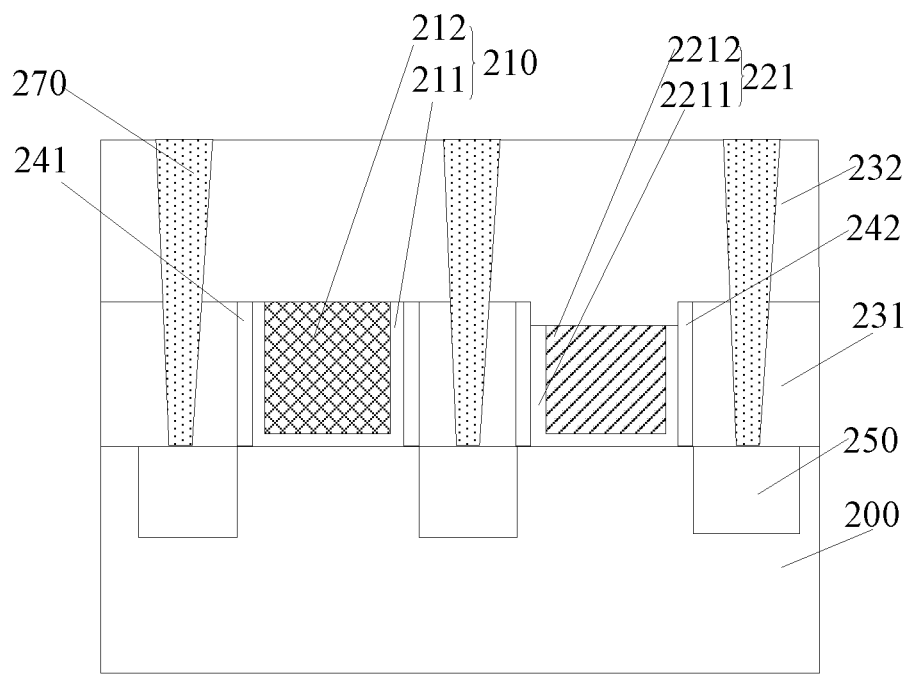

Returning to FIG. 2, after forming the second interlayer dielectric layer, conductive plugs may be formed respectively in the dielectric layers at two sides of the first gate structure and in the dielectric layers at two sides of the second gate structure (S208). FIG. 9 illustrates a corresponding structure.

As shown in FIG. 9, conductive plugs 270 are formed respectively in the dielectric layers at two sides of the first gate structure 210 and in the dielectric layers at two sides of the second gate structure 221. The conductive plugs have a width decreasing from top to bottom.

In one embodiment, for the conductive plugs 270 located at two sides of the first gate structure 210 and adjacent to the first gate structure 210, a width direction of the conductive plugs 270 is parallel to a length direction of a channel region in the substrate 200 at a bottom of the first gate structure 210. For the conductive plugs 270 located at two sides of the second gate structure 221 and adjacent to the second gate structure 221, a width direction of the conductive plug 270 is parallel to a length direction of a channel region in the substrate 200 at a bottom of the second gate structure 221.

The conductive plugs 270 are respectively located above the source/drain doped regions 250 and are electrically connected to the source/drain doped regions 250.

In one embodiment, the top surface of the first gate structure 210 is higher than the top surface of the second gate structure 221, and the width of the conductive plugs 270 decreases from top to bottom. Accordingly, a minimum distance between the first gate structure 210 and the adjacent conductive plugs 270 is less than a minimum distance between the second gate structure 221 and the adjacent conductive plugs 270. Since the minimum distance between the first gate structure 210 and the adjacent conductive plugs 270 is smaller, the anti-fuse may be easily broken down. That is, the anti-fuse may easily change from an isolated state to a conductive state. Thus, the programming voltage and the programming time of the anti-fuse may be reduced.

When the anti-fuse is being broken down, a channel current corresponding to the first gate structure 210 and a channel current corresponding to the second gate structure 211 provide a breakdown current for the anti-fuse.

The anti-fuse is formed by utilizing the first gate structure 210, the conductive plug 270 at two sides of the first gate structure 210, and a dielectric material between the first gate structure 210 and the adjacent first conductive plug 270. The dielectric material includes the dielectric layer and the first sidewall spacer 241 that are located between the first gate structure 210 and the adjacent first conductive plug 270. Since no additional region of the substrate is used to form the anti-fuse, integration of the anti-fuse structural circuit may be improved.

The minimum distance between the first gate structure 210 and the adjacent conductive plugs 270 refers to a minimum distance between an edge of the first gate structure 210 to edges of the adjacent conductive plugs 270. The minimum distance between the second gate structure 221 and the adjacent conductive plugs 270 refers to a minimum distance between an edge of the second gate structure 221 to edges of the adjacent conductive plugs 270.

In one embodiment, the programming voltage of the anti-fuse is in a range of approximately 0.5 volts to 10 volts. The operating voltage applied to the second gate structure 221 is in a range of approximately 0.5 volts to 2 volts.

The present disclosure also provides an exemplary anti-fuse structure circuit formed by a process consistent with the disclosed embodiments. As shown in FIG. 9, the anti-fuse structure circuit includes a substrate 200 and an anti-fuse. The anti-fuse includes a first gate structure 210 and a dielectric layer that are located above the substrate 200, and the dielectric layer covers the first gate structure 210. The anti-fuse also includes conductive plugs 270 located respectively in dielectric layer at two sides of the first gate structure 210. The conductive plugs 270 have a width decreasing from top to bottom.

The anti-fuse structure circuit also includes a second gate structure 221 above the substrate 200. A top surface of the first gate structure 210 is higher than a top surface of the second gate structure 221, and the dielectric layer also covers the second gate structure 221. The conductive plugs 270 are also located respectively in the dielectric layer at two sides of the second gate structure 221. A height of the first gate structure 210 is approximately 1.1 times to 1.3 times a height of the second gate structure 221.

The first gate structure 210 includes a first gate dielectric layer 211 on the substrate 200 and a first gate electrode layer 212 on the first gate dielectric layer 211. The second gate structure 221 includes a second gate dielectric layer 2211 on the substrate 200 and a second gate electrode layer 2212 on the second gate dielectric layer 2211. A top surface of the first gate electrode layer 212 is higher than a top surface of the second gate electrode layer 2212.

In one embodiment, a thickness of the first gate dielectric layer 211 is greater than a thickness of the second gate dielectric layer 2211.

In one embodiment, the thickness of the first gate dielectric layer 211 is approximately 1.2 times to 5 times the thickness of the second gate dielectric layer 2211. A programming voltage of the anti-fuse may be equal to an operating voltage applied to the second gate structure.

In some other embodiments, the programming voltage of the anti-fuse may be greater than the operating voltage applied to the second gate structure. In some other embodiments, the thickness of the first gate dielectric layer may be less than or equal to the thickness of the second gate dielectric layer.

In one embodiment, the programming voltage of the anti-fuse is approximately 0.5 volts to 10 volts, and the operating voltage applied to the second gate structure is approximately 0.5 volts to 2 volts.

The dielectric layer includes a first interlayer dielectric layer 231 and a second interlayer dielectric layer 232.

In one embodiment, the anti-fuse structure circuit also includes a first sidewall spacer 241 and a second sidewall spacer 242. The first sidewall spacer 241 is located at a sidewall of the first gate structure 210, and the second sidewall spacer 242 is located at a sidewall of the second gate structure 221. A top surface of the first gate structure 210 is flush with a top surface of the first sidewall spacer 241, and a top surface of the second gate structure 221 is lower than a top surface of the second sidewall spacer 242. The first interlayer dielectric layer 231 covers a sidewall of the first sidewall spacer 241 and a sidewall of the second sidewall spacer 242. The second interlayer dielectric layer 232 is located above the first gate structure 210, the second gate structure 221, the first side wall spacer 241, the second side wall spacer 242, and the first interlayer dielectric layer 231.

The anti-fuse structure circuit also includes source/drain doped regions 250. The source/drain doped regions 250 are located respectively in the substrate 200 at two sides of the first gate structure 210 and in the substrate 200 at two sides of the second gate structure 221. Specifically, the source/drain doped regions 250 are located respectively in the substrate 200 at two sides of the first gate structure 210 and the first sidewall spacer 241, and in the substrate 200 at two sides of the second gate structure 221 and the second sidewall spacer 242.

The conductive plugs 270 are respectively located above the source/drain doped regions 250 and are electrically connected to the source/drain doped regions 250.

The present disclosure also provides another exemplary process of forming an anti-fuse structure circuit. The exemplary process includes forming a recess in the first interlayer dielectric layer above the second gate structure when the second initial gate structure is etched back to form the second gate structure. A sidewall of the recess exposes the second sidewall spacer. The exemplary process also includes forming a protective layer in the recess before forming the second interlayer dielectric layer. After forming the second interlayer dielectric layer, the second interlayer dielectric layer is located above the protective layer. The protective layer is made of a material including silicon nitride.

The present disclosure also provides another exemplary anti-fuse structure circuit including a protective layer in a recess in a first interlayer dielectric layer above a second gate structure. The anti-fuse structure circuit also includes a second interlayer dielectric layer located above the protective layer. The protective layer is made of a material including silicon nitride.

As disclosed, the technical solutions of the present disclosure have the following advantages.

In an anti-fuse structure circuit provided by the technical solutions of the present invention, a top surface of the first gate structure is higher than a top surface of the second gate structure, and the conductive plugs have a width decreasing from top to bottom. Accordingly, a minimum distance between the first gate structure and the adjacent conductive plugs is less than a minimum distance between the second gate structure and the adjacent conductive plugs. Since the minimum distance between the first gate structure and the adjacent conductive plugs is smaller, the anti-fuse may be easily broken down, and thus the programming voltage and the programming time of the anti-fuse may be decreased.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A method of forming an anti-fuse structure circuit, comprising:
    providing a substrate;
    forming an anti-fuse on the substrate by a process including
        forming a first gate structure and a dielectric layer on the substrate, the dielectric layer covering the first gate structure, and forming conductive plugs respectively in the dielectric layer at two sides of the first gate structure, the conductive plugs having a width decreasing from top to bottom; and
    forming a second gate structure on the substrate, wherein a top surface of the first gate structure is higher than a top surface of the second gate structure, the dielectric layer also covers the second gate structure, and the conductive plugs are also located respectively in the dielectric layer at two sides of the second gate structure.

2. The method according to claim 1, wherein:
    the dielectric layer includes a first interlayer dielectric layer and a second interlayer dielectric layer;
    a process of forming the first gate structure, the second gate structure, and the dielectric layer includes:
        forming a first gate structure, a second initial gate structure, and a first interlayer dielectric layer on the substrate, wherein a height of the first gate structure and a height of the second initial gate structure are same, the first interlayer dielectric layer covers a sidewall of the first gate structure and a sidewall of the second initial gate structure, and the first interlayer dielectric layer exposes the top surface of the first gate structure and a top surface of the second initial gate structure; and
        etching back the second initial gate structure to lower the height of the second initial gate structure and to turn the second initial gate structure into a second gate structure, and
        forming the second interlayer dielectric layer on the first gate structure, the second gate structure and the first interlayer dielectric layer; and
    after forming the first gate structure, the second gate structure and the dielectric layer, forming the conductive plugs.

3. The method according to claim 2, further comprising:
    before etching back the second initial gate structure, forming a mask layer on the first gate structure and a portion of the first interlayer dielectric layer around the first gate structure, wherein the mask layer exposes the second initial gate structure;

using the mask layer as an etching mask, etching back the second initial gate structure to form the second gate structure; and before forming the second interlayer dielectric layer, removing the mask layer.

4. The method according to claim 2, further comprising, before forming the conductive plugs, forming a first sidewall spacer and a second sidewall spacer, wherein:

the first sidewall spacer is located at a sidewall of the first gate structure, and the second sidewall spacer is located at a sidewall of the second gate structure;

a top surface of the first gate structure is flush with a top surface of the first sidewall spacer, and a top surface of the second gate structure is lower than a top surface of the second sidewall spacer; and the first interlayer dielectric layer covers a sidewall of the first sidewall spacer and a sidewall of the second sidewall spacer, and the second interlayer dielectric layer is also located on the first sidewall spacer and the second sidewall spacer.

5. The method according to claim 4, further comprising:

forming a recess in the first interlayer dielectric layer above the second gate structure simultaneously when etching back the second initial gate structure to form the second gate structure, wherein a sidewall of the recess exposes the second sidewall spacer; and forming a protective layer in the recess before forming the second interlayer dielectric layer, wherein after forming the second interlayer dielectric layer, the second interlayer dielectric layer remains over the protective layer.

6. The method according to claim 1, further comprising: forming source/drain doped regions, wherein:

the source/drain doped regions are located respectively in the substrate at two sides of the first gate structure and in the substrate at two sides of the second gate structure; and the conductive plugs are respectively located above the source/drain doped regions and are electrically connected to the source/drain doped regions.

7. The method according to claim 1, wherein a height of the first gate structure is approximately 1.1 times to 1.3 times a height of the second gate structure.

8. The method according to claim 1, wherein:

the first gate structure includes a first gate dielectric layer on the substrate and a first gate electrode layer on the first gate dielectric layer;

the second gate structure includes a second gate dielectric layer on the substrate and a second gate electrode layer on the second gate dielectric layer; and a top surface of the first gate electrode layer is higher than a top surface of the second gate electrode layer.

9. The method according to claim 8, wherein a thickness of the first gate dielectric layer is greater than a thickness of the second gate dielectric layer.

10. The method according to claim 9, wherein the thickness of the first gate dielectric layer is approximately 1.2 times to 5 times the thickness of the second gate dielectric layer.

11. The method according to claim 10, wherein a programming voltage of the anti-fuse is equal to an operating voltage applied to the second gate structure.

12. The method according to claim 1, wherein the programming voltage of the anti-fuse is approximately 0.5 volts to 10 volts, and the operating voltage applied to the second gate structure is approximately 0.5 volts to 2 volts.

13. An anti-fuse structure circuit, comprising:

a substrate;

an anti-fuse, including a first gate structure and a dielectric layer that are located on the substrate, the dielectric layer covering the first gate structure, and conductive plugs located respectively in the dielectric layer at two sides of the first gate structure, the conductive plugs having a width decreasing from top to bottom; and a second gate structure located on the substrate, wherein a top surface of the first gate structure is higher than a top surface of the second gate structure, the dielectric layer also covers the second gate structure, and the conductive plugs are also located respectively in the dielectric layer at two sides of the second gate structure.

14. The anti-fuse structure circuit according to claim 13, wherein a height of the first gate structure is approximately 1.1 times to 1.3 times a height of the second gate structure.

15. The anti-fuse structure circuit according to claim 13, wherein:

the first gate structure includes a first gate dielectric layer on the substrate and a first gate electrode layer on the first gate dielectric layer;

the second gate structure includes a second gate dielectric layer on the substrate and a second gate electrode layer on the second gate dielectric layer; and a top surface of the first gate electrode layer is higher than a top surface of the second gate electrode layer.

16. The anti-fuse structure circuit according to claim 15, wherein a thickness of the first gate dielectric layer is greater than a thickness of the second gate dielectric layer.

17. The anti-fuse structure circuit according to claim 16, wherein the thickness of the first gate dielectric layer is approximately 1.2 times to 5 times the thickness of the second gate dielectric layer.

18. The anti-fuse structure circuit according to claim 17, wherein a programming voltage of the anti-fuse is equal to an operating voltage applied to the second gate structure.

19. The anti-fuse structure circuit according to claim 13, wherein the programming voltage of the anti-fuse is approximately 0.5 volts to 10 volts, and the operating voltage applied to the second gate structure is approximately 0.5 volts to 2 volts.

20. The anti-fuse structure circuit according to claim 13, further comprising:

a first interlayer dielectric layer covering sidewalls of the first gate structure and the second gate structures, and exposing top surfaces of the first gate structure and the second gate structure;

a recess in the first interlayer dielectric layer above the second gate structure;

a protective layer in the recess; and a second interlayer dielectric layer located on the protective layer, wherein:

the dielectric layer includes the first interlayer dielectric layer and the second interlayer dielectric layer; and the protective layer is made of a material including silicon nitride.

* * * * *